(12) United States Patent
Rolandi (10) Patent No.: US 6,965,523 B2
(45) Date of Patent: Nov. 15, 2005

(54) MULTILEVEL MEMORY DEVICE WITH MEMORY CELLS STORING NON-POWER OF TWO VOLTAGE LEVELS

(75) Inventor: Paolo Rolandi, Voghera (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/964,160

(22) Filed: Oct. 12, 2004

(65) Prior Publication Data

US 2005/0063219 A1 Mar. 24, 2005

Related U.S. Application Data

(62) Division of application No. 10/259,252, filed on Sep. 26, 2002, now Pat. No. 6,816,407.

(30) Foreign Application Priority Data

Sep. 28, 2001 (EP) .................................. 01830614

(51) Int. Cl.[7] .............................................. G11C 16/04
(52) U.S. Cl. .......................... 365/185.03; 365/185.21; 365/185.28
(58) Field of Search ...................... 365/185.03, 185.18, 365/185.2, 185.21, 185.28

(56) References Cited

U.S. PATENT DOCUMENTS

| | | | |
|---|---|---|---|
| 5,021,999 A | 6/1991 | Kohda et al. ................ | 365/168 |
| 5,093,805 A | 3/1992 | Singh .......................... | 365/51 |
| 5,218,569 A | 6/1993 | Banks ..................... | 365/189.01 |
| 5,315,558 A | 5/1994 | Hag ....................... | 365/230.01 |
| 5,539,690 A * | 7/1996 | Talreja et al. ........... | 365/185.22 |
| 5,815,443 A * | 9/1998 | Sweha et al. ........... | 365/189.05 |
| 5,835,414 A | 11/1998 | Hung et al. ............. | 365/185.25 |
| 5,854,763 A | 12/1998 | Gillingham et al. ... | 365/189.04 |
| 6,064,597 A | 5/2000 | Takeshima et al. ..... | 365/185.24 |
| 6,118,692 A | 9/2000 | Banks ..................... | 365/185.03 |
| 6,243,290 B1 | 6/2001 | Kurata et al. ........... | 365/185.03 |
| 6,297,988 B1 | 10/2001 | Parker et al. ........... | 365/185.03 |
| 6,373,767 B1 | 4/2002 | Patti .......................... | 365/210 |
| 2003/0018861 A1 * | 1/2003 | Micheloni et al. .......... | 711/154 |

FOREIGN PATENT DOCUMENTS

EP 1 024 527 A2 8/2000

* cited by examiner

*Primary Examiner*—Son Mai
(74) *Attorney, Agent, or Firm*—Lisa K. Jorgenson; Robert Iannucci; Seed IP Law Group PLLC (57) ABSTRACT

According to the multilevel programming method, each memory location can be programmed at a non-binary number of levels. The bits to be stored in the two locations are divided into two sets, wherein the first set defines a number of levels higher than the non-binary number of levels. During programming, if the first set of bits to be written corresponds to a number smaller than the non-binary number of levels, the first set of bits is written in the first location and the second set of bits is written in the second location; if it is greater than the non-binary number of levels, the first set of bits is written in the second location and the second set of bits is written in the first location. The bits of the first set in the second location are stored in different levels with respect to the bits of the second set.

26 Claims, 5 Drawing Sheets

MULTILEVEL MEMORY DEVICE WITH MEMORY CELLS STORING NON-POWER OF TWO VOLTAGE LEVELS

This Application is a Division of U.S. application Ser. No. 10/259,252 filed Sep. 26, 2002, issued as U.S. Pat. No. 6,816,407.

BACKGROUND OF THE INVENTION

1. Field of the Invention

The present invention relates to a method for storing and reading data in a multilevel nonvolatile memory and to an architecture therefor.

2. Description of the Related Art

According to the most recent market surveys, the most promising applications of nonvolatile memories, in particular EPROM and FLASH memories, in the coming years will mainly regard data storage in the digital audio/video sector, which is currently undergoing a marked expansion.

It is known that the aforesaid applications require increasingly large memories, for example to enable storage of several music pieces on a same medium or to increase the photographic quality (for example, by increasing the number of pixels).

An important design technique therefor includes the possibility of programming each memory cell at a level chosen from among a plurality of levels. At present, the voltage levels usable for programming a cell are binary levels (equal to m, with $m=2^n$, where n is the number of information bits that can be stored in the cell). In practice, the law that governs multilevel reading and writing is of a binary type, in so far as memories handle binary data, i.e., at two voltage levels (either high or low, corresponding, from an electrical standpoint, to ground voltage and supply voltage).

Currently memories with two bits per cell, i.e., four-level memories, are in an advanced stage of development and enable doubling of the capacity of the memory. In addition, memories with an even higher number of bits per cell, namely with three or even four bits per cell, corresponding to eight and sixteen levels, are under study. For these memories, above all in the case of sixteen levels, it is very difficult to use the same circuits as for four-level memories; consequently, the time spent in developing products increases considerably, and the know-how acquired remains unexploited. In fact, from the standpoints of the design and engineering development, multilevel architecture is very burdensome.

In order to prevent the need for technical staff to continue to develop products that involve so much expenditure, it is therefore preferable to develop architectures that exploit prior know-how to the full, enabling the design of multilevel memories to advance by short steps and departing as little as possible from the prior art.

BRIEF SUMMARY OF THE INVENTION

An embodiment of the present invention provides a management method and an architecture that allow an increase in the storage capacity of a nonvolatile memory, without requiring complete re-design of the memory with respect to the prior art. The method for stores data in a multilevel storage device that includes a plurality of memory locations, each of which can be programmed at a plurality of voltage levels. The method includes programming each of the memory locations at any of N voltage levels, where N is a non-power of two, depending on where a value for storage in the memory location falls among N−1 thresholds.

BRIEF DESCRIPTION OF THE SEVERAL VIEWS OF THE DRAWINGS

For a better understanding of the present invention, a preferred embodiment thereof is now described, purely by way of non-limiting example, with reference to the attached drawings, wherein.

DETAILED DESCRIPTION OF THE INVENTION

According to an embodiment of the invention, in each cell of a multilevel memory a non-binary number of levels is stored, in particular, a number of levels $m=(2^n+2)$, for example six, is stored. Since in any case the datum to be supplied to the memory must be of a binary type, an encoding method is provided that enables association of the stored non-binary levels to binary codes.

To this aim, contiguous pairs of cells are associated together, so that they can be read and written simultaneously. In the case, provided by way of example, of storing six levels per cell, which is described hereinafter, without the invention being limited to the specific case, this corresponds to the possibility of storing twelve different levels, which are the information content of each pair of cells. Since 12=8+4, this information content corresponds to having 3+2 bits, namely, 5 bits every two memory cells. For example, in a 128-Mcell memory, the binary information content is (5/2) *128=320 Mbits, instead of 256 Mbits that may be obtained with a four-level memory (wherein each cell can be programmed at four different voltage levels).

With an organization of this sort, the memory cells are read in pairs using read circuits associated to each memory cell and able to discriminate at least 6 levels. Since the memory cells are read in pairs, a pair of memory cells or adjacent physical cells—hereinafter also referred to as adjacent memory locations—forms a virtual cell and is addressed by a single address (Ax, Ay).

In the above situation, according to a possible solution, each set of five bits to be written or read is broken down into a first set of bits made up of three bits and into a subsequent set of bits made up of two bits. The first set of bits requires eight different levels to be stored. These eight different levels are stored as follows: the first location stores the first six levels, and the second location stores the remaining two levels, which are preferably chosen from between the two higher levels usable in the second location; the second set of bits requires four different levels, which must be stored in a location other than that used for the first set of bits.

Consequently, when the first set of bits encodes one of the first six levels of the first:set:of bits (which, as has been said, can be stored in the first location), the second set of bits can be stored in the second location. This is the situation shown in FIG. 1a, which illustrates the six levels usable in the first location and the four levels usable in the second location. In this case, the two higher levels of the second location are "forbidden" levels; i.e., they cannot be programmed.

When, instead, the seventh level and the eighth level of the first set of bits (which, as has been said, are stored in the second location) are to be stored, the second set of bits cannot be stored in the second location, and thus the first location is used. This is the situation shown in FIG. 1b, which illustrates level 7 and level 8 of the first set of bits stored in the second location and the four levels of the second set of bits stored in the first location. In this case, the four lower levels of the second location and the two higher levels of the first location are "forbidden" levels; i.e., they cannot be used.

Figure 1A:
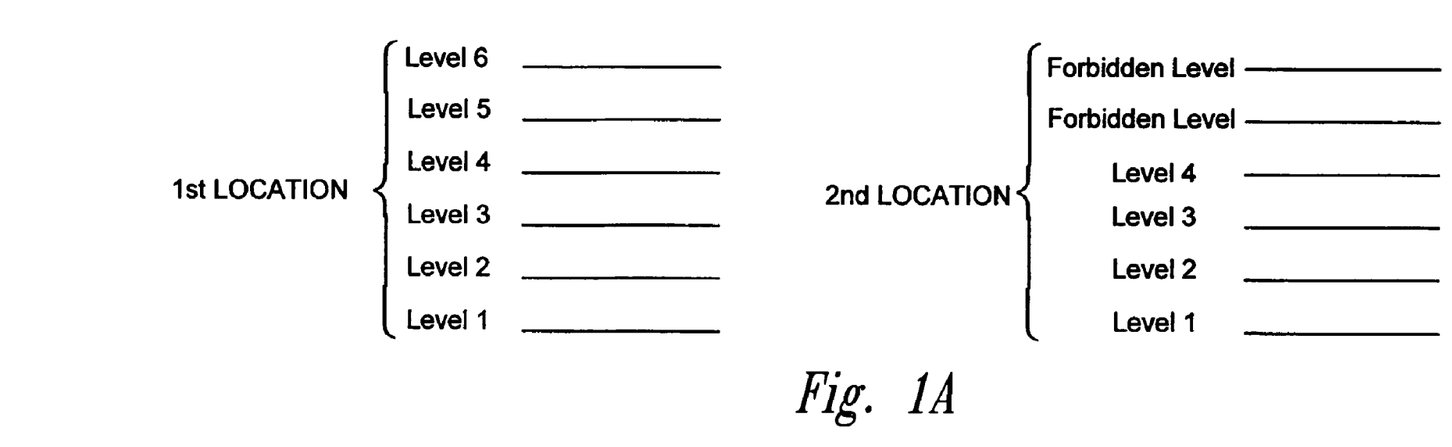
FIGS. 1a and 1b show the organization of the voltage levels in two adjacent memory cells in two different cases.
Figure 1B:
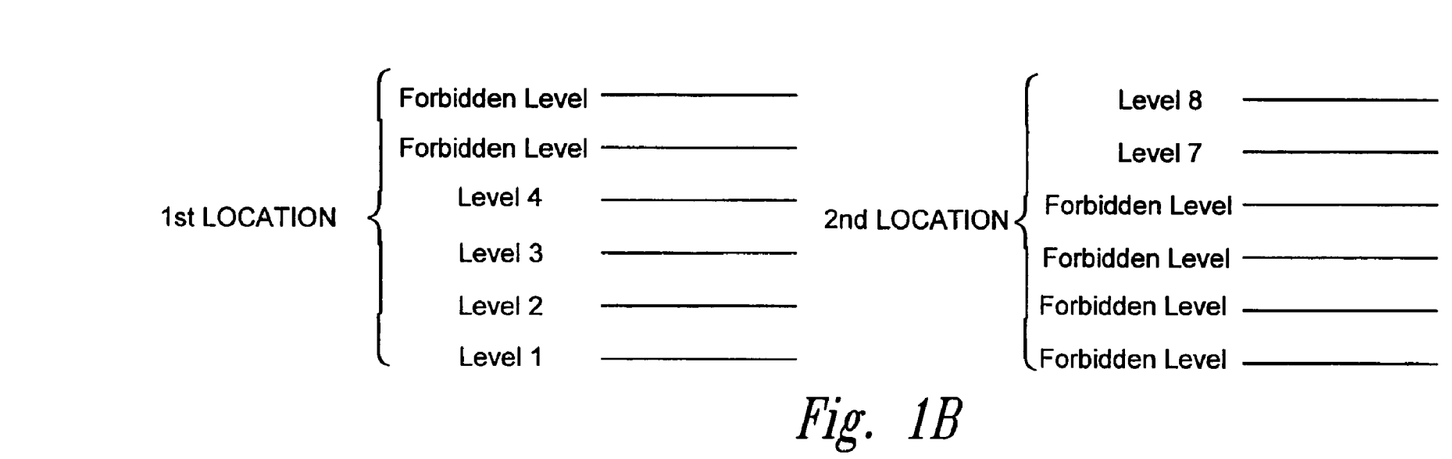

In practice, with the encoding method shown in FIGS. 1a and 1b, reading of the two higher levels of the second location indicates which of the following two situations is present: if the last two levels of the second location have not been used, this means that reading the first location supplies the first set of three bits and reading the second location supplies the second set of two bits; if, instead, the two higher levels of the second location have been used, this means that reading the first location supplies the second set of two bits and reading the second location supplies the first set of three bits.

In either case, the last two levels of the two locations cannot be used simultaneously.

Figure 2A:
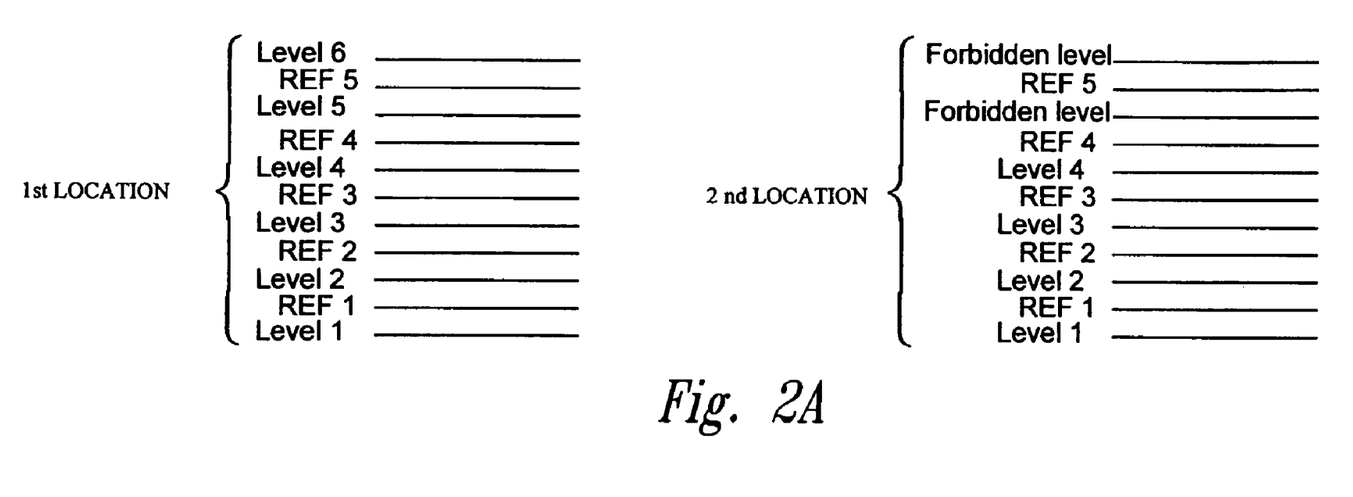
FIGS. 2a and 2b show the position of the reference voltages that can be used with the organization of the levels illustrated in FIGS. 1a and 1b.
Figure 2B:
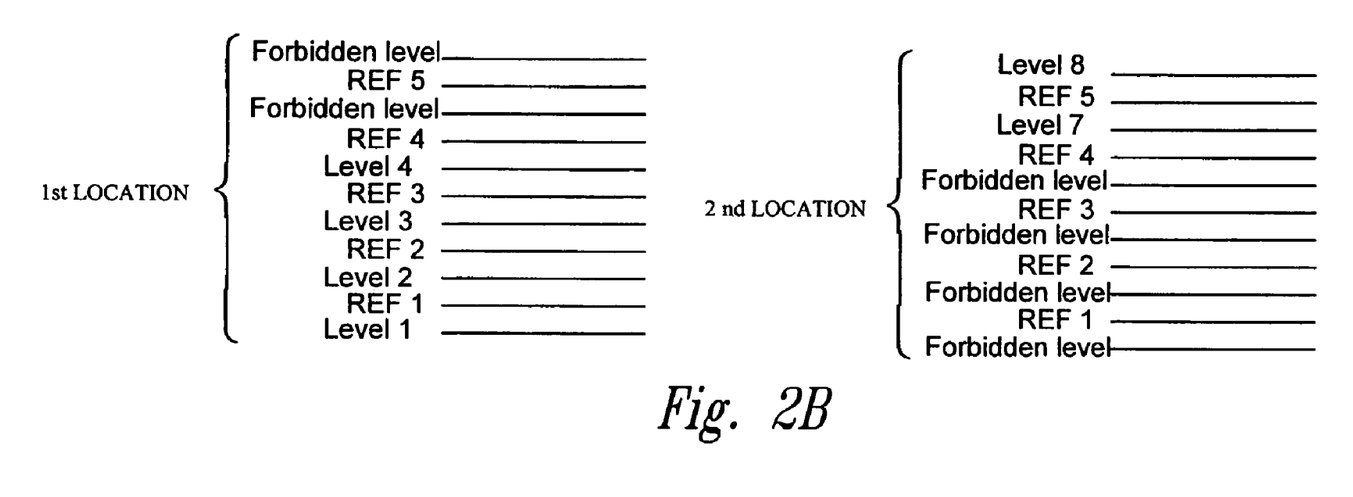

FIGS. 2a and 2b show the arrangement of the reference levels used for reading the memory locations in the two cases represented in FIGS. 1a and 1b. As for circuits according to the prior art, for discriminating six levels, five references REF1–REF5 are used, which are arranged approximately halfway between pairs of successive levels.

Figure 3:
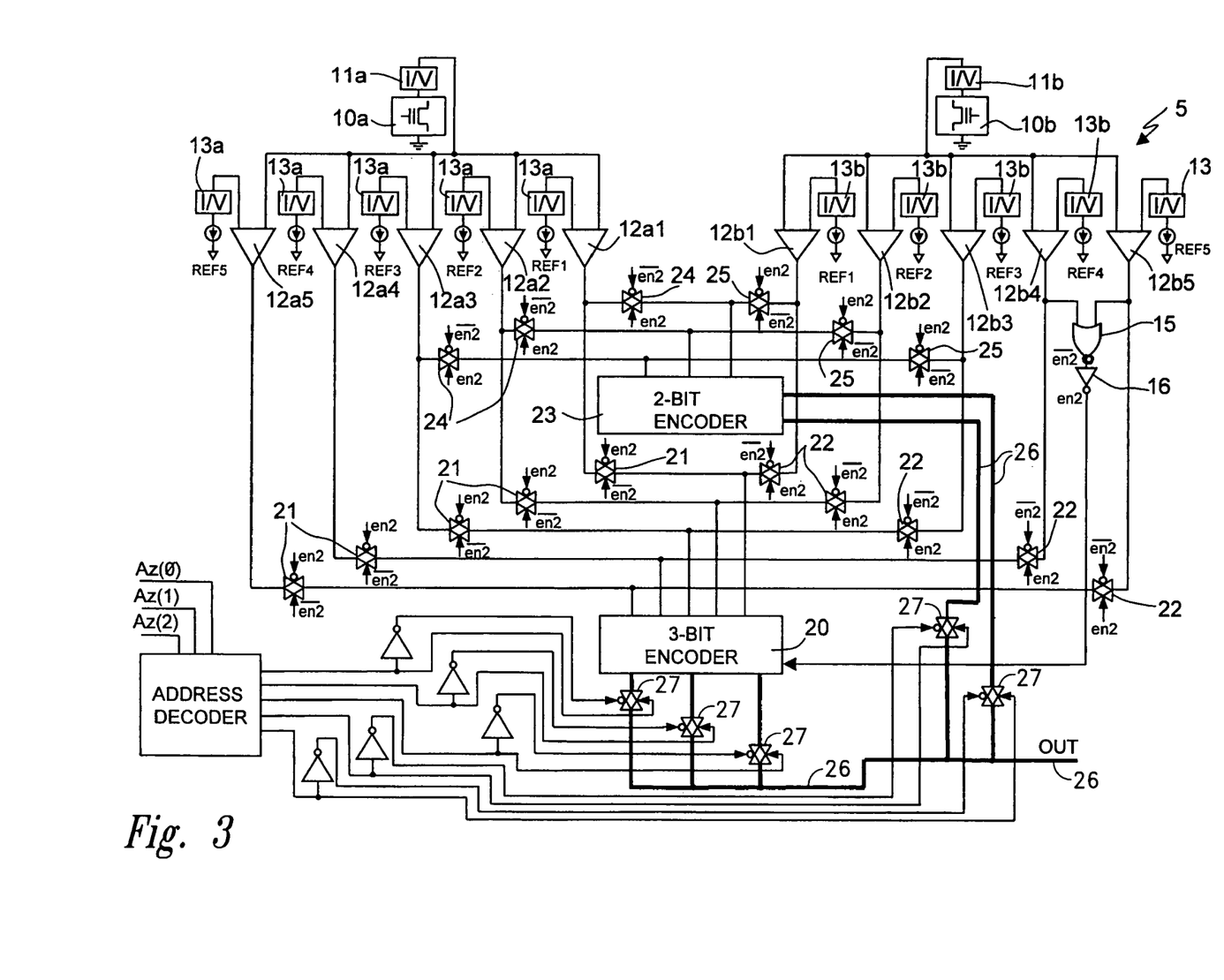
FIG. 3 shows a read circuit for pairs of adjacent cells programmed according to the organization shown in FIGS. 1a and 1b and using the references of FIGS. 2a and 2b.

FIG. 3 shows a block diagram of the circuitry for decoding the information contained in two adjacent memory locations, designated by 10a and 10b, organized in the way described above and belonging to a memory device 5. The circuitry of FIG. 3 implements a parallel sensing which, as is known, is the simplest and provides the best performance from an electrical standpoint.

In the diagram of FIG. 3, the memory locations 10a, 10b are each connected to a respective current-to-voltage converter 11a, 11b via an addressing circuit (known and not illustrated). The output of the current-to-voltage converter 11a is connected to a first input of five sense amplifiers 12a1–12a5, which have a second input that receives one of five references REF1–REF5 via respective current-to-voltage converters 13a. Likewise, the output of the current-to-voltage converter 11b is connected to a first input of five sense amplifiers 12b1–12b5, the second input whereof receive one of five references REF1–REF5 via respective current-to-voltage converters 13b.

The outputs of the sense amplifiers 12b4, 12b5 connected to the second location 10b and receiving the references REF4 and REF5 are connected to respective inputs of a NOR gate 15, which is cascade-connected to an inverter 16 supplying a signal en2, of a high logic level only when at least one of the two sense amplifiers 12b4, 12b5 connected thereto has a high output. In practice, the signal en2 is high when the second memory location stores the seventh or the eighth level of the first set of bits; otherwise, it is zero. Consequently, its value indicates whether the first set of bits is to be read in the first memory location 10a and the second set of bits is to be read in the second memory location 10b (en2=0), or vice versa (en2=1).

The outputs of the sense amplifiers 12a1–12a5 are connected to a 3-bit encoder 20 via respective CMOS switches 21, controlled by the signal en2 so as to be closed when en2=0. The outputs of the sense amplifiers 12b1–12b5 are connected to the 3-bit encoder 20 via respective CMOS switches 22, controlled by the signal en2 so as to be closed when en2=1. Thereby, when en2=0, the 3-bit encoder 20 receives the outputs of the sense amplifiers 12a1–12a5, and when en2=1, the 3-bit encoder 20 receives the outputs of the sense amplifiers 12b1–12b5. The 3-bit encoder 20 moreover receives the signal en2 so as to discriminate the fifth and sixth levels from the seventh and eighth levels.

The outputs of the sense amplifiers 12a1–12a3 are connected to a 2-bit encoder 23 via respective CMOS switches 24, controlled by the signal en2 so as to be closed when en2=1. The outputs of the sense amplifiers 12b1–12b3 are connected to the 2-bit encoder 23 via respective CMOS switches 25, controlled by the signal en2 so as to be closed when en2=0. Thereby, when en2=0, the 2-bit encoder 23 receives the outputs of the sense amplifiers 12b1–12b3, and when en2=1, the 2-bit encoder 23 receives the outputs of the sense amplifiers 12a1–12a3.

The 3-bit encoder 20 and the 2-bit encoder 23 are connected to respective output lines 26, along which switches 27 are arranged and controlled by the output signals of an address encoder, which in turn receives three address signals Az(0), Az(1) and Az(2).

Figure 4:
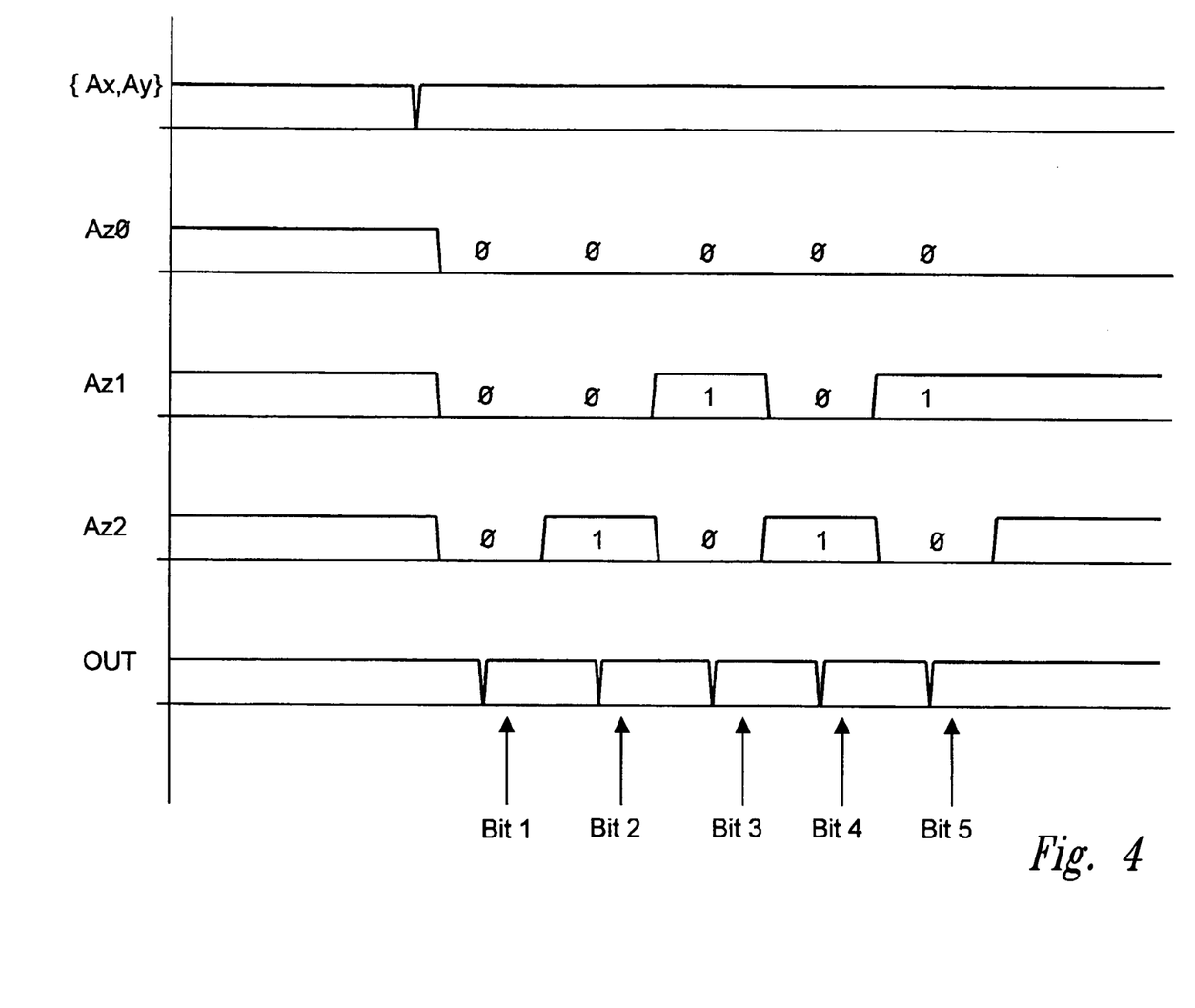
FIG. 4 shows the waveforms of the timing signals during reading with the present organization.

Reading the information contained in the two memory locations 10a, 10b takes place whenever there is a variation in the addresses {Ax, Ay} (FIG. 4) which causes, in a known way, generation of a pulse of an address-transition detection signal ATD (not shown), which in turn generates all the read sync signals known to the persons skilled in the art. Consequently, the contents of the two memory locations 10a, 10b addressed are read and encoded by the circuitry of FIG. 3, taking the values of the first set of bits and of the second set of bits in the way previously described. The bits thus encoded are outputted sequentially using an appropriate combination of addresses {$Az_n$}, as shown in the timing of FIG. 4.

Figure 5:
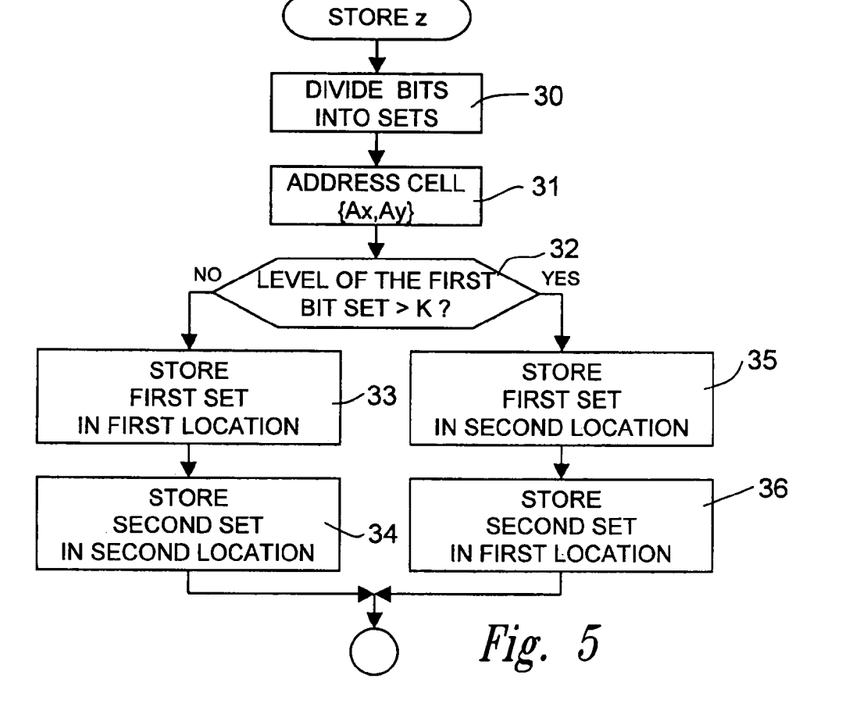
FIG. 5 shows a flow-chart for storing voltage levels in the two cases of FIGS. 1a and 1b.
Figure 6:
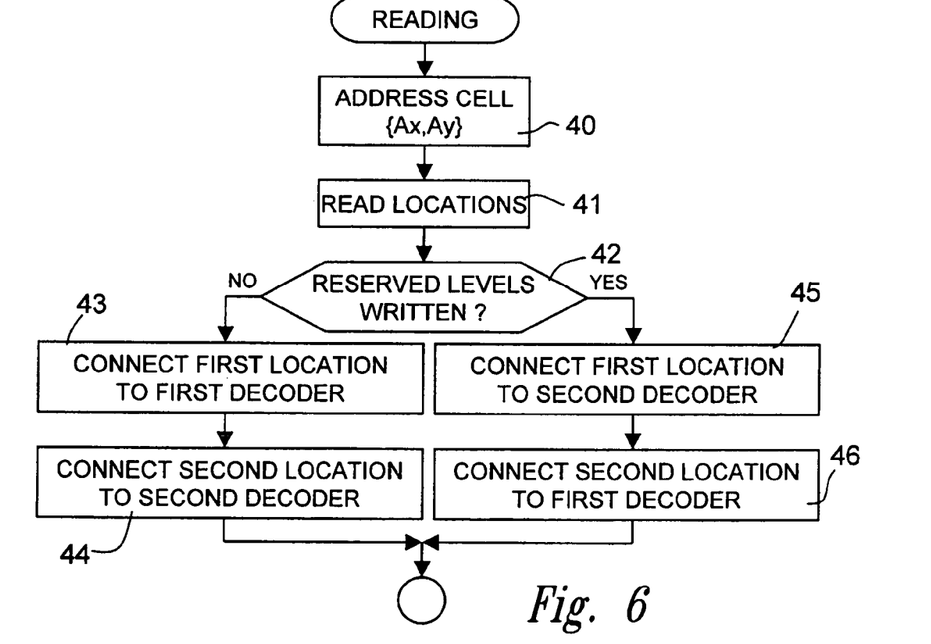
FIG. 6 is a flow-chart for reading the voltage levels in the two cases illustrated of FIGS. 1a and 1b.

Operations for writing and reading a virtual cell of address (Ax, Ay) are shown in FIGS. 5 and 6.

According to FIG. 5, which regards writing, initially a set of bits that are to be stored is divided into two or more sets, step 30. Then, the virtual cell of address (Ax, Ay) is addressed, step 31. It is verified whether the first set of bits (in the example considered above, three bits) encodes a number higher than the number of levels that can be stored in a single location (in the example, whether level 7 or level 8 is to be stored), step 32. If not, the first set of bits is stored in a first location (in the example, in the first memory location 10a); i.e., the first location is programmed at a level corresponding to the value encoded by the first set of bits, step 33, and the second set of bits is stored in a second location (in the example shown, in the second memory location 10b); i.e., the second location is programmed at a level given by the value encoded by the second set of bits, step 34. In the affirmative,-the first set of bits is stored in the second location, step 35, and the second set of bits is stored in the first location (programming of the first location at the value encoded by the second set of bits), step 36.

According to FIG. 6 and to what explained for the circuit of FIG. 3, during reading, first the virtual cell of address (Ax, Ay) is addressed, step 40. Then the cell is read, step 41. It is verified whether one of the levels of the second location reserved to the first set of bits has been written (in the example, whether level 5 and/or level 6 of the second memory location 10b has been written), step 42. If not, the read circuits of the first location are connected to the encoder of the first set of bits (in the example shown, to the 3-bit encoder 20), step 43, and the read circuits of the second location are connected to the encoder of the second set of bits (in the example to the 2-bit encoder 23), step 44. In the affirmative, the read circuits of the first location are connected to the encoder of the second set of bits, step 45, and the read circuits of the second location are connected to the encoder of the first set of bits, step 46.

The solution described herein affords the important advantage of implementing a non-binary architecture for reading the information stored in nonvolatile memory cells, with minimal overall dimensions and a minimal logic complexity, exploiting known multilevel techniques.

Finally, it is clear that numerous modifications and variations may be made to the method and memory described and illustrated herein, all falling within the scope of the invention, as defined in the attached claims. In particular, the same architecture may be applied for storing any non-binary number of levels in each memory location. The choice of the particular location to be used for storing each set of bits is arbitrary. The levels associated to each set of bits can be chosen in a way different from the one illustrated. The levels encoded by the first set of bits and stored in the second memory location may be other than the ones illustrated (for instance, the second memory location 10b could store levels 1 and 2, instead of 7 and 8, of the first set of bits; in this case, the first memory location should store levels 3–8 of the first set of bits). Finally, reading may be performed via a different type of multilevel sensing, such as merely serial dichotomous, mixed parallel-serial sensing, etc. Furthermore, from a theoretical standpoint it is possible to store more than two sets of bits in more than two adjacent memory locations.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A multilevel memory device comprising:
    a plurality of virtual memory cells each including a plurality of memory locations, each of which can be programmed at a plurality of voltage levels; and
    a reading circuit configured to read each of the memory locations at any of N voltage levels, where N is a non-power of two, depending on where a value stored in the memory location falls among N−1 thresholds.

2. The memory device of claim 1, wherein N is $2^n+2$ and $n \geq 2$.

3. The memory device of claim 2, wherein N is six.

4. The memory device of claim 1, wherein an integer number of bits is stored in a virtual memory cell that includes at least two of the memory locations.

5. The memory device of claim 4, wherein the integer number of bits is divided into at least two sets of bits, including a first set of bits, defining a first number of levels that is greater than N, and a second set of bits defining a second number of levels that is less than N; wherein the reading circuit includes:
    means for determining whether a first memory location of the memory locations of the virtual cell stores a value that correspond to one of the levels of the first set of bits or a value that corresponds to one of the levels of the second set of bits; and
    means for reading the first set of bits from a second memory location of the memory locations of the virtual cell if the first memory location stores a value that corresponds to one of the levels of the second set of bits.

6. The memory device of claim 5, wherein the reading circuit includes means for reading the second set of bits from the second memory location if the first memory location stores a value that corresponds to one of the levels of the first set of bits.

7. The memory device of claim 4 wherein the integer number of bits is an odd number.

8. The memory device of claim 1, wherein the reading circuit includes:
    a first set of sense amplifiers coupled to a first one of the memory locations;
    a second set of sense amplifiers coupled to a second one of the memory locations;
    a first encoder that encodes the voltage levels of the memory locations into bit values; and
    a routing circuit structured to alternately electrically connect the first encoder to the first set of sense amplifiers or the second set of sense amplifiers depending on the value of the voltage level stored in the first memory location.

9. The memory device of claim 8, wherein the reading circuit includes a second encoder that encodes the voltage levels of the memory locations into bit values, wherein the routing circuit is structured to alternately electrically connect the second encoder to the second set of sense amplifiers or the first set of sense amplifiers depending on the value of the voltage level stored in the first memory location.

10. A multilevel memory device comprising a plurality of virtual memory cells, each virtual memory cell including a pair of memory locations that together store an odd number of bits.

11. The memory device according to claim 10, further comprising:
    a first set of sense amplifiers coupled to a first memory location of a selected one of the memory cells;
    a second set of sense amplifiers coupled to a second memory location of the selected memory cell;
    a first encoder that encodes voltage levels of the memory cells into bit values; and
    a routing circuit structured to alternately electrically connect the first encoder to the first set of sense amplifiers or the second set of sense amplifiers depending on a value of a voltage level stored in the first memory location of the selected memory cell.

12. The memory device according to claim 11, further comprising a second encoder that encodes voltage levels of the memory cells into bit values, wherein the routing circuit is structured to alternately electrically connect the second encoder to the second set of sense amplifiers or the first set of sense amplifiers depending on the value of the voltage level stored in the first memory location of the selected memory cell.

13. The memory device according to claim 10, wherein each memory cell is addressed by a single address.

14. The memory device according to claim 10, wherein the memory locations of each memory cell are adjacent.

15. The memory device according to claim 10, further comprising:
    means for dividing the odd number of bits of a selected one of the memory cells into first and second sets of bits;
    first checking means for checking whether the first set of bits encodes a value to be stored in a first of the memory locations of the selected memory cell, the first checking means generating storage information having a first value and a second value;
    first programming means for writing the first set of bits in the first memory location and the second set of bits in a second of the memory locations of the selected memory cell, the first programming means being activated in presence of the first value of the storage information; and
    second programming means for writing the first set of bits in the second memory location and the second set of bits in the first memory location, the second programming means being activated in presence of the second value of the storage information.

16. The memory device according to 15, wherein the first programming means comprise first writing means for writing the second set of bits in a first sub-set of levels of the second memory location, the first writing means being activated in presence of the first value of the storage information; and the second programming means comprise second writing means for storing the first set of bits in a second sub-set of levels of the second memory location, the second sub-set of levels being separate from the first sub-set of levels, the second writing means being activated in presence of the second value of the storage information.

17. The memory device according to claim 16, comprising:
    a first read circuit associated with the first memory location;
    a second read circuit associated with the second memory location;
    second checking means for checking whether one of the levels of the second sub-set of levels of the second memory location has been written, the second checking means generating a level-check signal having a first value and a second value;
    a first encoder for the first set of bits;
    a second encoder for the second set of bits;
    first routing means connecting the first read circuit to the first encoder in presence of the first value of the level-check signal, and connecting the first read circuit to the second encoder in presence of the second value of the level-check signal; and
    second routing means connecting the second read circuit to the second encoder in presence of the first value of the level-check signal, and connecting the second read circuit to the first encoder in presence of the second value of the level-check signal.

18. A multilevel memory device, comprising:
    first and second memory locations that together store a group of bits that includes first and second sets of bits;
    means for storing the first set in the second memory location if a value of the bits of the first set is greater than a reference value; and
    means for storing the first set in the first memory location if the value of the bits of the first set is less than the reference value.

19. The memory device of claim 18, further comprising:
    means for storing the second set in the first memory location if the value of the bits of the first set is greater than the reference value; and
    means for storing the second set in the second memory location if the value of the bits of the first set is less than the reference value.

20. The memory device of claim 18 wherein one of the first and second sets consists of an odd number of bits and another of first and second sets consists of an even number of bits.

21. A multilevel memory device comprising:
    a plurality of virtual memory cells each including a plurality of memory locations structured to store respective voltage values; and
    a write circuit coupled to the memory locations and structured to program the memory locations of each virtual memory cell with the respective voltage values within N predetermined ranges, where N is a non-power of two.

22. The memory device according to claim 21, wherein pairs of the memory locations are associated together and form a plurality of virtual memory cells, each the memory cell being addressed by a single address.

23. The memory device according to claim 22, wherein the memory locations of each memory cell are adjacent.

24. The memory device according to claim 22, further comprising:
    means for dividing an integer number of bits, to be stored in a selected one of the memory cells, into first and second sets of bits, wherein the first set of bits is an integer number greater than N;
    first checking means checking whether the first set of bits encodes a value to be stored in a first of the memory locations of the selected memory cell, the first checking means generating storage information having a first value and a second value;
    first programming means for writing the first set of bits in the first memory location and the second set of bits in a second of the memory locations of the selected memory cell, the first programming means being activated in presence of the first value of the storage information; and
    second programming means for writing the first set of bits in the second memory location and the second set of bits in the first memory location, the second programming means being activated in presence of the second value of the storage information.

25. The memory device according to 24, wherein the first programming means comprise first writing means for writing the second set of bits in a first sub-set of levels of the second memory location, the first writing means being activated in presence of the first value of the storage information; and the second programming means comprise second writing means for storing the first set of bits in a second sub-set of levels of the second memory location, the second sub-set of levels being separate from the first sub-set of levels, the second writing means being activated in presence of the second value of the storage information.

26. The memory device according to claim 25, comprising:
    a first read circuit associated with the first memory location;
    a second read circuit associated with the second memory location;

second checking means for checking whether one of the levels of the second sub-set of levels of the second memory location has been written, the second checking means generating a level-check signal having a first value and a second value;

a first encoder for the first set of bits;

a second encoder for the second set of bits;

first routing means connecting the first read circuit to the first encoder in presence of the first value of the level-check signal, and connecting the first read circuit to the second encoder in presence of the second value of the level-check signal; and second routing means connecting the second read circuit to the second encoder in presence of the first value of the level-check signal, and connecting the second read circuit to the first encoder in presence of the second value of the level-check signal.

\* \* \* \* \*